(12) United States Patent
Bi et al.

(10) Patent No.: US 11,276,612 B2
(45) Date of Patent: *Mar. 15, 2022

(54) HYBRID-CHANNEL NANO-SHEET FETS

(71) Applicant: TESSERA, INC., San Jose, CA (US)

(72) Inventors: Zhenxing Bi, Niskayuna, NY (US); Kangguo Cheng, Schenectady, NY (US); Peng Xu, Guilderland, NY (US); Wenyu Xu, Albany, NY (US)

(73) Assignee: Tessera, Inc., San Jose, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 16/681,347

(22) Filed: Nov. 12, 2019

(65) Prior Publication Data

US 2020/0098642 A1 Mar. 26, 2020

Related U.S. Application Data

(63) Continuation of application No. 15/903,167, filed on Feb. 23, 2018, now Pat. No. 10,504,793, which is a
(Continued)

(51) Int. Cl.
| | |
|---|---|
| *H01L 21/8238* | (2006.01) |
| *H01L 21/02* | (2006.01) |
| *H01L 29/66* | (2006.01) |
| *H01L 27/092* | (2006.01) |
| *H01L 29/786* | (2006.01) |
| *H01L 29/06* | (2006.01) |

(Continued)

(52) U.S. Cl.
CPC ........... *H01L 21/823807* (2013.01); *H01L 21/02532* (2013.01); *H01L 21/02603* (2013.01); *H01L 21/823814* (2013.01); *H01L 21/823821* (2013.01); *H01L 21/823842* (2013.01); *H01L 27/092* (2013.01); *H01L 27/0924* (2013.01); *H01L 29/0665* (2013.01); *H01L 29/42392* (2013.01); *H01L 29/66439* (2013.01); *H01L 29/66545* (2013.01); *H01L 29/775* (2013.01); *H01L 29/78696* (2013.01); *H01L 29/6681* (2013.01)

(58) Field of Classification Search
CPC ......... H01L 29/78696; H01L 29/66545; H01L 21/823821; H01L 27/0924; H01L 27/092; H01L 21/02532; H01L 21/823842; H01L 29/42392; H01L 21/02603
See application file for complete search history.

(56) References Cited

U.S. PATENT DOCUMENTS

| | | |
|---|---|---|
| 7,893,492 B2 | 2/2011 | Bedell et al. |
| 8,017,464 B2 | 9/2011 | Sugiyama et al. |
| (Continued) | | |

OTHER PUBLICATIONS

List of IBM Patents or Patent Applications Treated as Related dated Nov. 12, 2019, 2 pages.

(Continued)

*Primary Examiner* — Phat X Cao

(57) ABSTRACT

Semiconductor devices and methods of forming a first layer cap at ends of layers of first channel material in a stack of alternating layers of first channel material and second channel material. A second layer cap is formed at ends of the layers of second channel material. The first layer caps are etched away in a first device region. The second layer caps are etched away in a second device region.

20 Claims, 9 Drawing Sheets

Related U.S. Application Data continuation of application No. 15/398,232, filed on Jan. 4, 2017, now Pat. No. 9,972,542.

(51) Int. Cl.
  *H01L 29/423* (2006.01)
  *H01L 29/775* (2006.01)

(56) References Cited

U.S. PATENT DOCUMENTS

| | | | |
|---|---|---|---|
| 8,084,308 B2 | 12/2011 | Chang et al. | |
| 8,361,297 B2 | 1/2013 | Mayer et al. | |
| 9,123,567 B2 | 9/2015 | Radosavljevic et al. | |
| 9,129,829 B2 | 9/2015 | Kuhn et al. | |
| 9,472,555 B1 | 10/2016 | Balakrishnan et al. | |
| 9,484,267 B1 * | 11/2016 | Cheng | H01L 21/02532 |
| 9,704,863 B1 * | 7/2017 | Cheng | H01L 21/823807 |
| 9,972,542 B1 * | 5/2018 | Bi | H01L 21/02532 |
| 10,276,586 B2 * | 4/2019 | Murakoshi | H01L 27/11578 |
| 10,504,793 B2 * | 12/2019 | Bi | H01L 21/02603 |
| 2004/0063286 A1 | 4/2004 | Kim et al. | |
| 2006/0240622 A1 | 10/2006 | Lee et al. | |
| 2009/0242405 A1 | 10/2009 | Mayer et al. | |
| 2010/0078690 A1 | 4/2010 | Sugiyama et al. | |
| 2014/0151639 A1 * | 6/2014 | Chang | H01L 27/1211 257/27 |
| 2015/0228480 A1 | 8/2015 | Yin et al. | |
| 2015/0236120 A1 | 8/2015 | Hashemi et al. | |
| 2016/0071729 A1 | 3/2016 | Hatcher et al. | |
| 2016/0086951 A1 | 3/2016 | Kim et al. | |
| 2017/0062428 A1 | 3/2017 | Cheng et al. | |
| 2017/0221708 A1 | 8/2017 | Bergendahl et al. | |

OTHER PUBLICATIONS

U.S. Office Action issued in U.S. Appl. No. 15/795,975 dated Mar. 16, 2018, 17 pages.

Final Office Action for U.S. Appl. No. 15/795,975 dated Sep. 10, 2018 (8 pages).

Notice of Allowance for U.S. Appl. No. 15/797,975 dated Feb. 8, 2019 (12 pages).

* cited by examiner

HYBRID-CHANNEL NANO-SHEET FETS

BACKGROUND

Technical Field

The present invention generally relates to semiconductor devices and, more particularly, to forming multiple transistor devices on a single substrate with different channel properties.

Description of the Related Art

As complementary metal-oxide semiconductor (CMOS) fabrication processes have improved and scaled down, the structures involved have reached nanometer scales. Various different nano-scale device architectures have been used to push the boundaries of CMOS technologies, including in particular nanosheet devices that use sheets of channel material having thicknesses measured in nanometers. However, different channel materials are needed for n-type field effect transistors as compared to p-type field effect transistors to attain optimal performance.

SUMMARY

A method of forming semiconductor devices includes forming a first layer cap at ends of layers of first channel material in a stack of alternating layers of first channel material and second channel material. A second layer cap is formed at ends of the layers of second channel material. The first layer caps are etched away in a first device region. The second layer caps are etched away in a second device region.

A method of forming semiconductor devices includes forming first layer caps at ends of layers of first material in stacks of alternating layers of first material and second material by oxidizing exposed portions of the first material. Second layer caps are formed at ends of the layers of second material. The first layer caps are etched away in a first device region. The second layer caps are etched away in a second device region.

A method of forming semiconductor devices includes forming first layer caps at ends of layers of first material in stacks of alternating layers of first material and second material. Second layer caps are formed at ends of the layers of second material by laterally etching the layers of the second material to form recesses and depositing a dielectric fill in the recesses. The first layer caps are etched away in a first device region. The second layer caps are etched away in a second device region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide n-type field effect transistors (NFETs) and p-type field effect transistors (PFETs) that have different channel materials and device properties. To accomplish this, a stack of alternating nanosheets is selectively patterned to expose one or the other type of channel material when forming source and drain regions.

Figure 1:
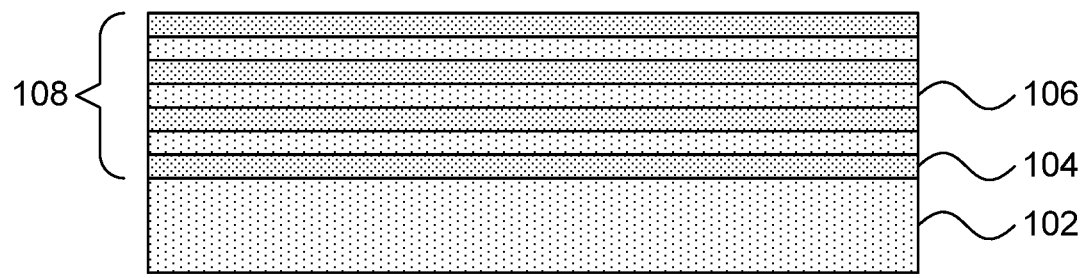
FIG. 1 is a cross-sectional diagram of a step in the formation of an integrated chip in accordance with the present principles.

Referring now to the drawings in which like numerals represent the same or similar elements and initially to FIG. 1, a cross-sectional diagram of a step in forming nanosheet FETs having different channel properties is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

A stack of alternating semiconductor layers 108 is formed on the semiconductor substrate 102. Layers of a first channel material 104 alternate with layers of a second channel material 106. The first and second channel materials have etch selectivity with respect to one another. As used herein, the term "selective" in reference to a material removal process denotes that the rate of material removal for a first material is greater than the rate of removal for at least another material of the structure to which the material removal process is being applied. In one specific embodiment, etch selectivity denotes a ratio of etch rates between an etched material and other materials of at least 10:1.

In one specific embodiment, the first layers of channel material are formed from silicon germanium and the second layers of channel material are formed from silicon. These two materials have etch selectivity with respect to one another, such that the material of one set of layers can be removed without substantially affecting the material of the other layers. It should be understood, however, that any appropriate combination of semiconductor materials having etch selectivity with respect to one another may be used instead.

The stack of alternating semiconductor layers 108 may be formed by any appropriate deposition process, including for example chemical vapor deposition (CVD), atomic layer deposition (CVD), physical vapor deposition (PVD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
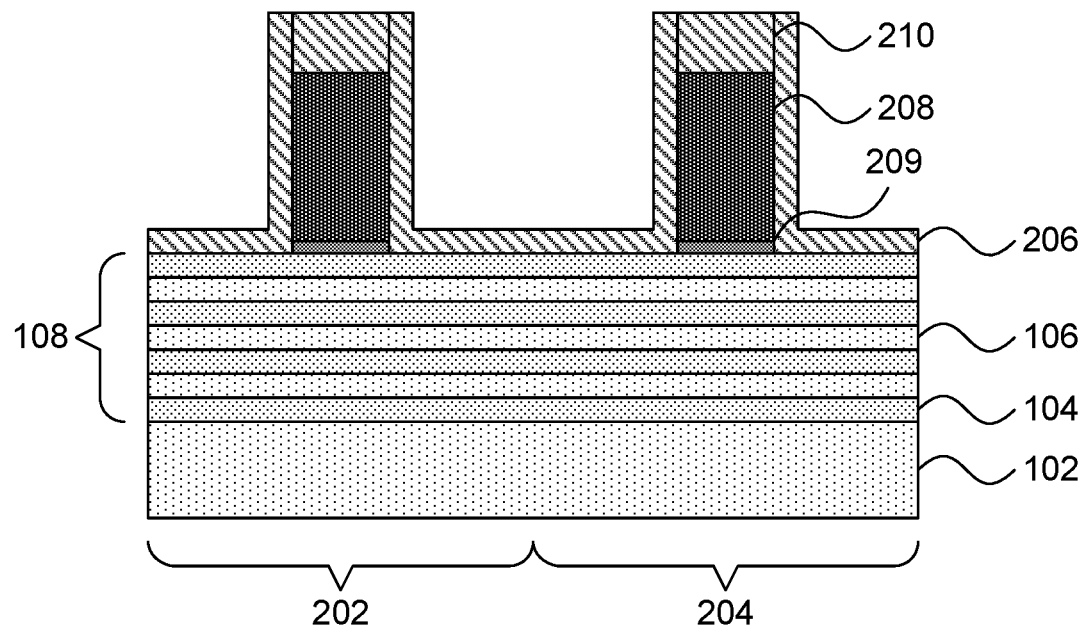
FIG. 2 is a cross-sectional diagram of a step in the formation of an integrated chip in accordance with the present principles.

Referring now to FIG. 2, a cross-sectional diagram of a step in forming nanosheet FETs having different channel properties is shown. The figure depicts an NFET region 202 and a PFET region 204. It should be understood that these two regions are formed on a single wafer and may be separated by a substantial distance. Dummy gates 208 are formed in the respective regions and may be formed from any appropriate material such as, e.g., polysilicon or amorphous silicon and are separated from the underlying stack of alternating semiconductor layers 108 by an insulator pad 209. The dummy gates 208 are surrounded by an insulator layer formed from, e.g., a gate pattern hardmask 210 and a spacer 206. It is specifically contemplated that the gate pattern hardmask 210 may be formed from any appropriate hardmask material such as, e.g., silicon nitride, and that the spacer 206 may be formed from any appropriate dielectric material including, e.g., silicon boron carbon nitride. It should be noted that the materials of the spacer 206 and the hardmask 210 should be selectively etchable with respect to one another.

The dummy gates 208 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form the gate pattern hardmask 210. Next, the photoresist pattern is removed and the gate pattern is then transferred into the dummy gate material during an anisotropic selective etching process, such as reactive ion etching (RIE). Alternatively, the first and second gate structure 6 can be formed by other patterning techniques such as spacer image transfer.

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
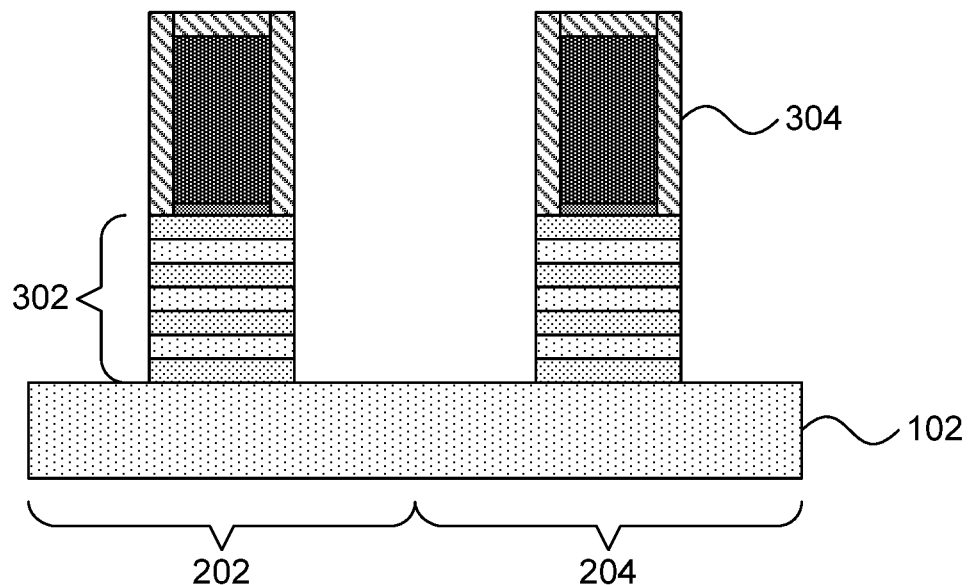
FIG. 3 is a cross-sectional diagram of a step in the formation of an integrated chip in accordance with the present principles.

Referring now to FIG. 3, a cross-sectional diagram of a step in forming nanosheet FETs having different channel properties is shown. An anisotropic etch is applied that stops on the substrate 102. The anisotropic etch should remove material from the spacer 206, such that it can penetrate to the underlying stack of layers 108, but should etch the stack of semiconductor layers 108 at a rate greater than the rate at which it etches the spacer 206 and the hardmask 210. This prevents the etch from damaging the dummy gate 208.

It is specifically contemplated that RIE may be used to perform the anisotropic etch. In one specific embodiment, multiple different etches may be used, with a first etch anisotropically removing material to remove material around the thicker gate pattern hardmask 206 and vertical spacer, followed by a second etch that is selective to the materials of the stack 108 without affecting the remaining hardmask materials. What remains is etched channel stacks 302 in the NFET regions 202 and the PFET regions 204, with the etched channel stacks 302 extending no farther than the remaining gate spacers 304.

Figure 4:
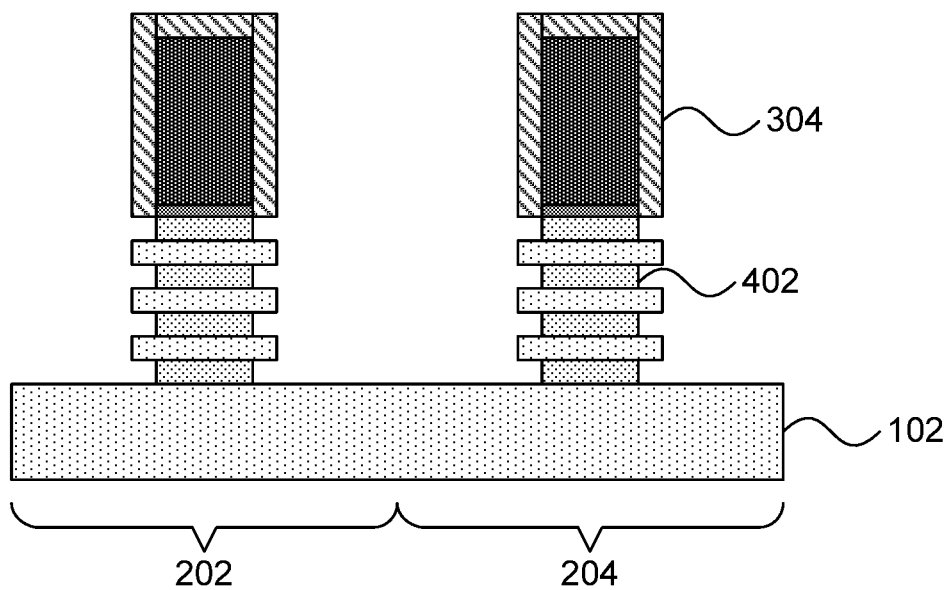
FIG. 4 is a cross-sectional diagram of a step in the formation of an integrated chip in accordance with the present principles.

Referring now to FIG. 4, a cross-sectional diagram of a step in forming nanosheet FETs having different channel properties is shown. An isotropic etch is used to laterally etch the first layers of channel material 104. The etch selectively removes material from the first layers of channel material 104 and leaves the material of the second layers of channel material in place 106, creating etched first channel material layers 402.

Figure 5:
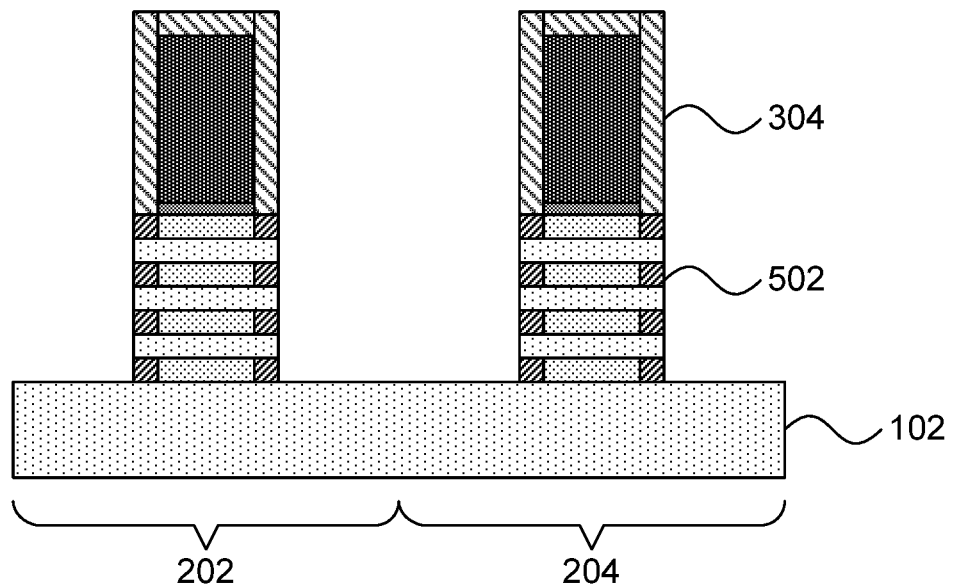
FIG. 5 is a cross-sectional diagram of a step in the formation of an integrated chip in accordance with the present principles.

Referring now to FIG. 5, a cross-sectional diagram of a step in forming nanosheet FETs having different channel properties is shown. A dielectric layer is conformally formed over the structures and subsequently etched away with an isotropic etch. In one specific example, CVD may be used to form the dielectric material. This forms dielectric plugs 502 at the exposed ends of the etched first channel material layers 402. One exemplary embodiment creates cavities that are, e.g., 6 nm high, filled with a 4 nm conformal dielectric layer that pinches off in the cavity. The isotropic etch then removes material from most surfaces, but the material will be thicker inside the cavities, such that the dielectric plugs 502 remain.

Figure 6:
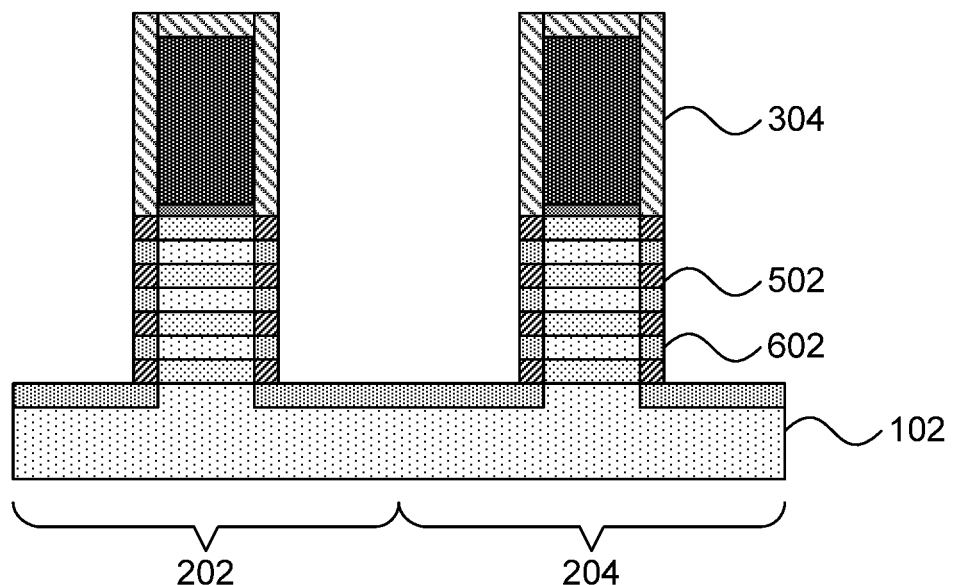
FIG. 6 is a cross-sectional diagram of a step in the formation of an integrated chip in accordance with the present principles.

Referring now to FIG. 6, a cross-sectional diagram of a step in forming nanosheet FETs having different channel properties is shown. The exposed surfaces of the second layers of channel material 106 are oxidized to form oxide caps 602. In the specific example where the second layers of channel material 106 and the substrate 102 are both formed from silicon, this step produces a silicon dioxide layer on all exposed silicon surfaces. It should be understood, however, that other embodiments make use of channel materials other than silicon and silicon germanium. As such, the formation of the plugs/caps 502 and 602 may involve other processes with the effect of creating selectively etchable structures at the ends of the respective channel nanosheets.

Figure 7:
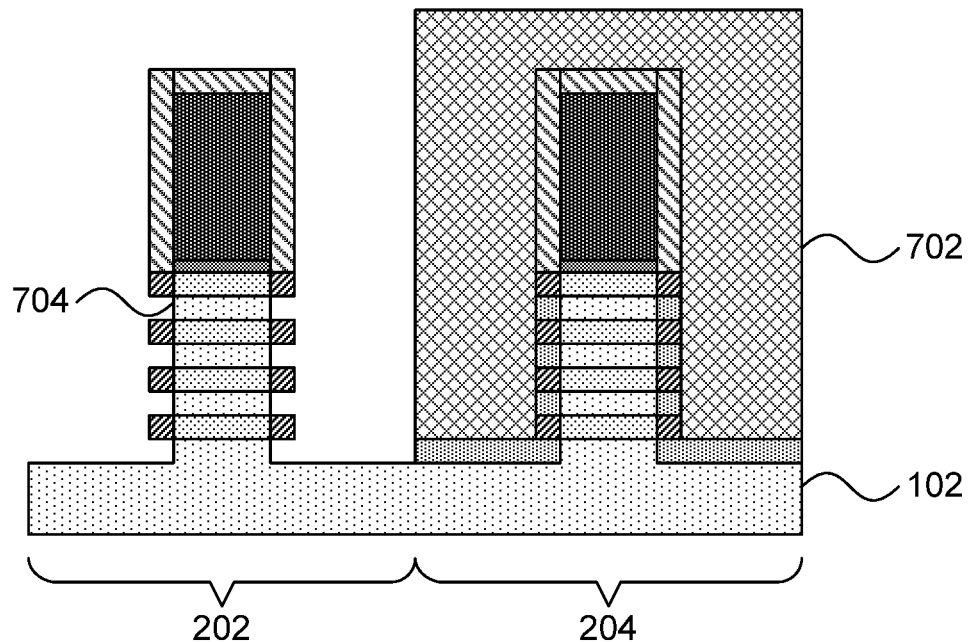
FIG. 7 is a cross-sectional diagram of a step in the formation of an integrated chip in accordance with the present principles.

Referring now to FIG. 7, a cross-sectional diagram of a step in forming nanosheet FETs having different channel properties is shown. The PFET region 204 is masked with any appropriate masking material 702, leaving the NFET region 202 exposed. The oxide material is removed, leaving ends of the etched second channel layers 704 exposed. It is specifically contemplated that the masking material 702 may be a polymer material.

Figure 8:
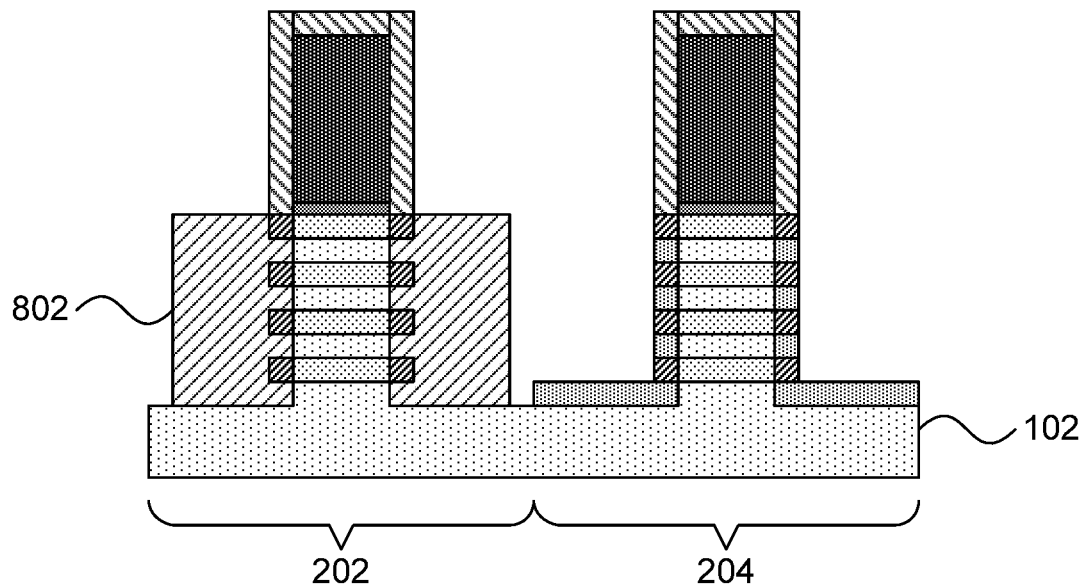
FIG. 8 is a cross-sectional diagram of a step in the formation of an integrated chip in accordance with the present principles.

Referring now to FIG. 8, a cross-sectional diagram of a step in forming nanosheet FETs having different channel properties is shown. The mask 702 is removed and source/drain regions 802 are epitaxially grown from the exposed ends of the etched second channel layers 704. It is specifically contemplated that the source/drain regions 802 may be doped in situ, but alternative embodiments may include doping by implantation that is performed before the mask 702 is removed. Any appropriate dopant may be selected for the source/drain regions 802 of the device in the NFET region 202.

In particular, an n-type dopant may be used to dope the source/drain regions 802. As used herein, "n-type" refers to the addition of impurities that contributes free electrons to an intrinsic semiconductor in a silicon containing substrate examples of n-type dopants, i.e., impurities, include but are not limited to antimony, arsenic and phosphorous. The dopant concentration in the source/drain region 802 can range from—about $1 \times 10^{19}$ cm$^{-3}$ to about $2 \times 10^{21}$ cm$^{-3}$, or preferably between $2 \times 10^{20}$ cm$^{-3}$ and $1 \times 10^{21}$ cm$^{-3}$.

Figure 9:
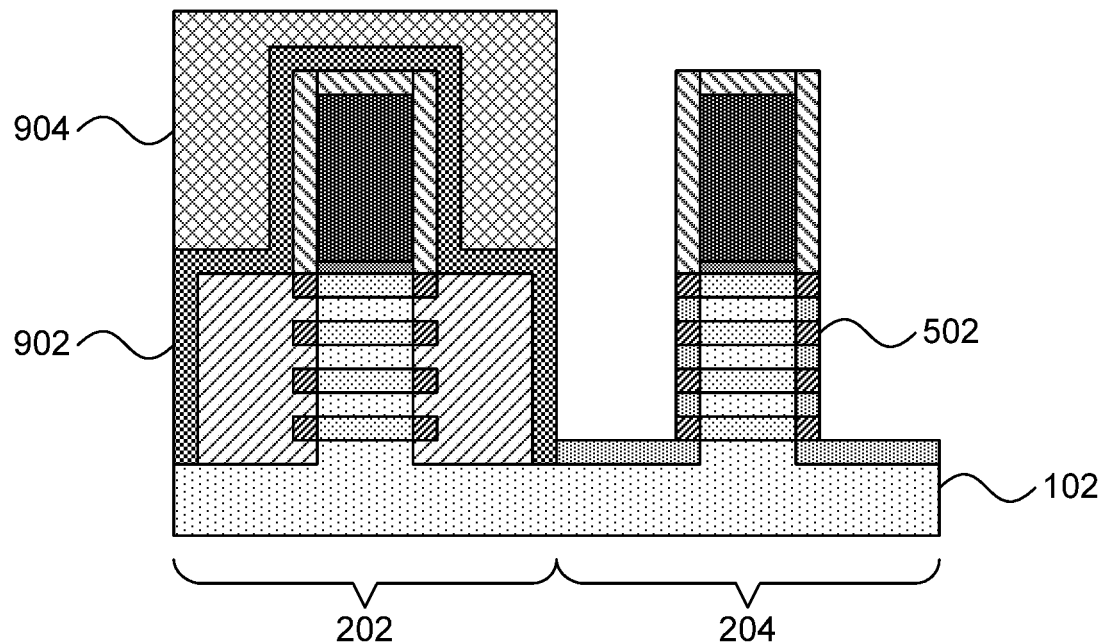
FIG. 9 is a cross-sectional diagram of a step in the formation of an integrated chip in accordance with the present principles.

Referring now to FIG. 9, a cross-sectional diagram of a step in forming nanosheet FETs having different channel properties is shown. A layer of spacer material is deposited over the nFET region 202 and the pFET region 204. The spacer material may be formed from, e.g., silicon carbon oxide or any other appropriate sacrificial material with etch selectivity to the other structures. A layer of mask material (e.g., a polymer) is then deposited over the nFET region 202 and the pFET region 204. It is specifically contemplated that at least the layer of spacer material may be deposited conformally. The sacrificial spacer layer and the layer of mask material are etched away in the pFET region 204 to expose the underlying pFET structures.

Figure 10:
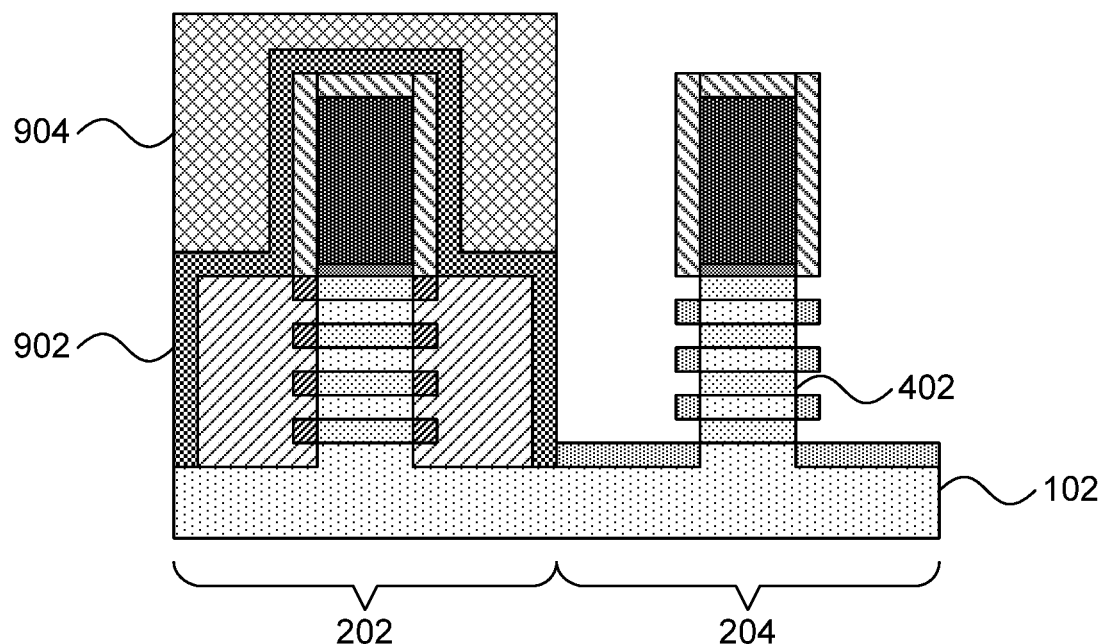
FIG. 10 is a cross-sectional diagram of a step in the formation of an integrated chip in accordance with the present principles.

Referring now to FIG. 10, a cross-sectional diagram of a step in forming nanosheet FETs having different channel properties is shown. The dielectric plugs 502 are etched away using, e.g., an isotropic etch such as a wet or dry chemical etch that selectively removes the plugs 502 without affecting the other structures.

Figure 11:
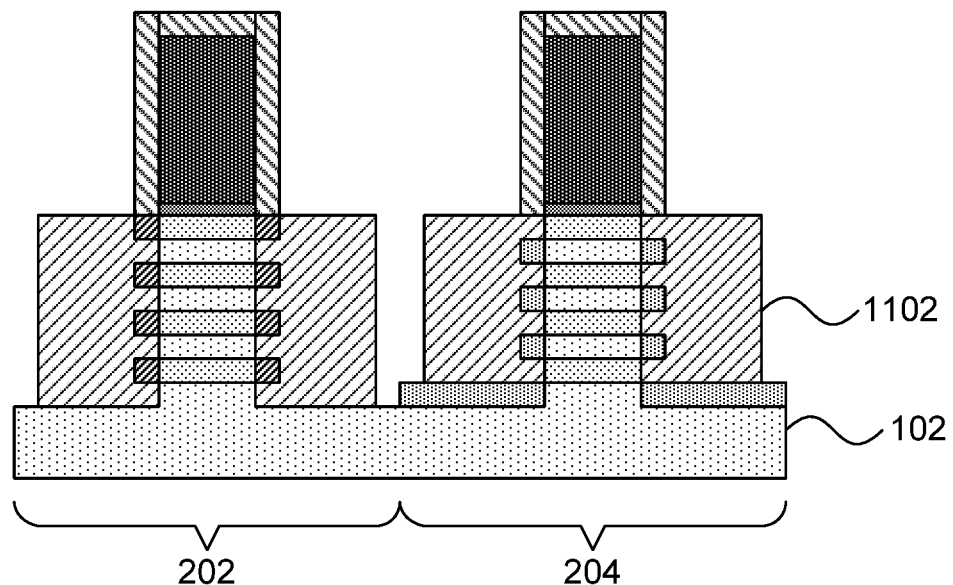
FIG. 11 is a cross-sectional diagram of a step in the formation of an integrated chip in accordance with the present principles.

Referring now to FIG. 11, a cross-sectional diagram of a step in forming nanosheet FETs having different channel properties is shown. The mask 904 is etched away before pFET source/drain regions 1102 are grown in the pFET region 204 from the exposed ends of the etched first channel material layers 402. It is specifically contemplated that the source/drain regions 1102 may be doped in situ, but alternative embodiments may include doping by implantation. Any appropriate dopant may be selected for the source/drain regions 1102 of the device in the pFET region 204. After formation of the pFET source/drain regions 1102, the sacrificial spacer layer 902 is removed.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. The dopant concentration in the source/drain region 1102 can range from about $1 \times 10^{19}$ cm$^{-3}$ to about $2 \times 10^{21}$ cm$^{-3}$, or preferably between $2 \times 10^{20}$ cm$^{-3}$ and $1 \times 10^{21}$ cm$^{-3}$.

Figure 12:
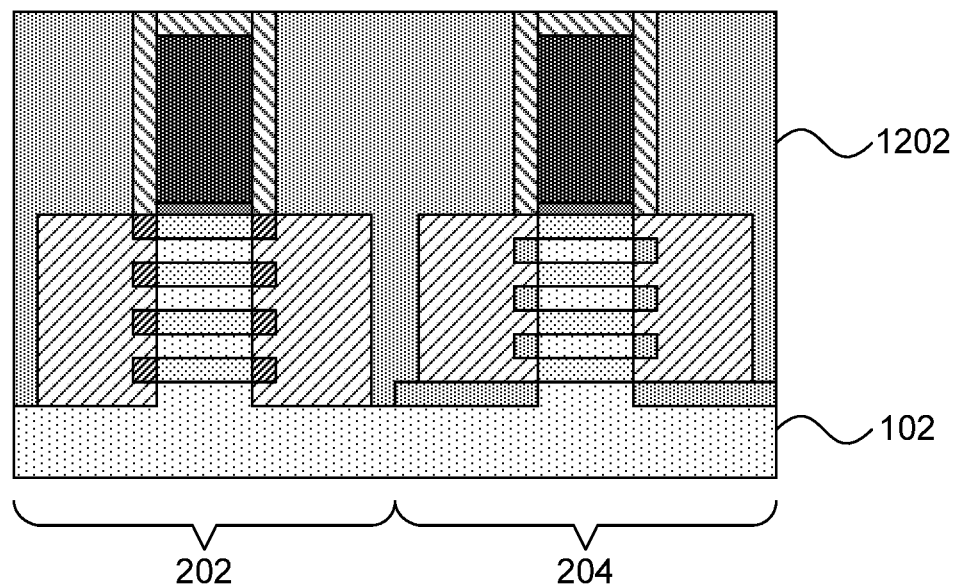
FIG. 12 is a cross-sectional diagram of a step in the formation of an integrated chip in accordance with the present principles.

Referring now to FIG. 12, a cross-sectional diagram of a step in forming nanosheet FETs having different channel properties is shown. A layer of dielectric material 1202 is formed over the nFET region 202 and the pFET region 204. It is specifically contemplated that the layer of dielectric material 1202 may be formed by depositing, e.g., a flowable oxide material such as silicon dioxide. The deposited dielectric material is then polished down to the level of the remaining hardmask 210 using, e.g., chemical mechanical planarization (CMP).

CMP is performed using, e.g., a chemical or granular slurry and mechanical force to gradually remove upper layers of the device. The slurry may be formulated to be unable to dissolve, for example, the material of the hardmask 210, resulting in the CMP process's inability to proceed any farther than that layer.

Figure 13:
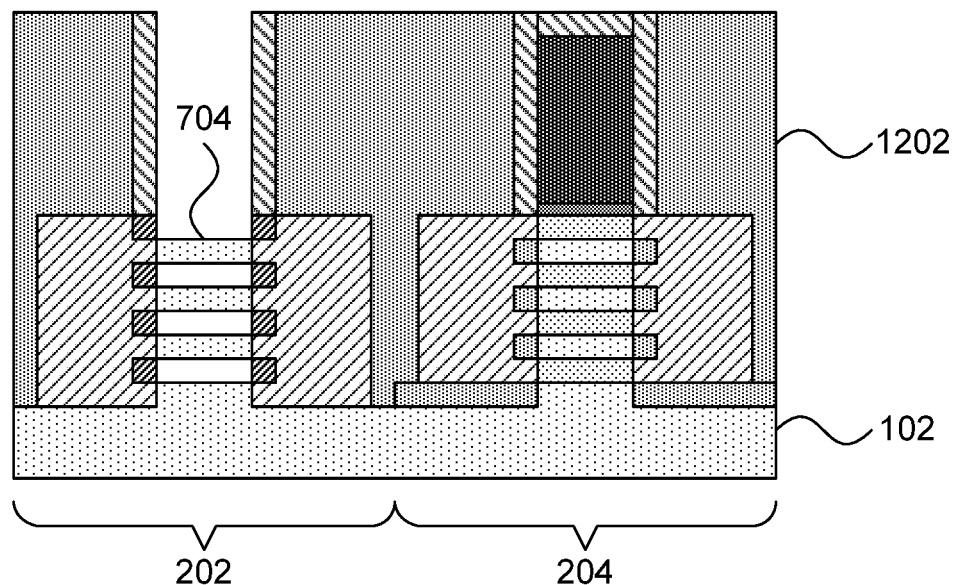
FIG. 13 is a cross-sectional diagram of a step in the formation of an integrated chip in accordance with the present principles.

Referring now to FIG. 13, a cross-sectional diagram of a step in forming nanosheet FETs having different channel properties is shown. The hardmask 210 is etched away, followed by the dummy gate 208 and dummy gate dielectric 209 in the nFET region 202. In addition, the remaining first channel material layers 402 in the nFET region 202 are etched away, leaving the etched second channel layers 704 exposed. The removal of these layers may be performed using one or more etches, but it should be noted that an isotropic etch of the hardmask 210, dummy gate 208, and dummy gate dielectric 209 in the nFET region 202 may be preceded by masking the pFET region 204 to prevent damage to corresponding structures in the pFET region 204.

Figure 14:
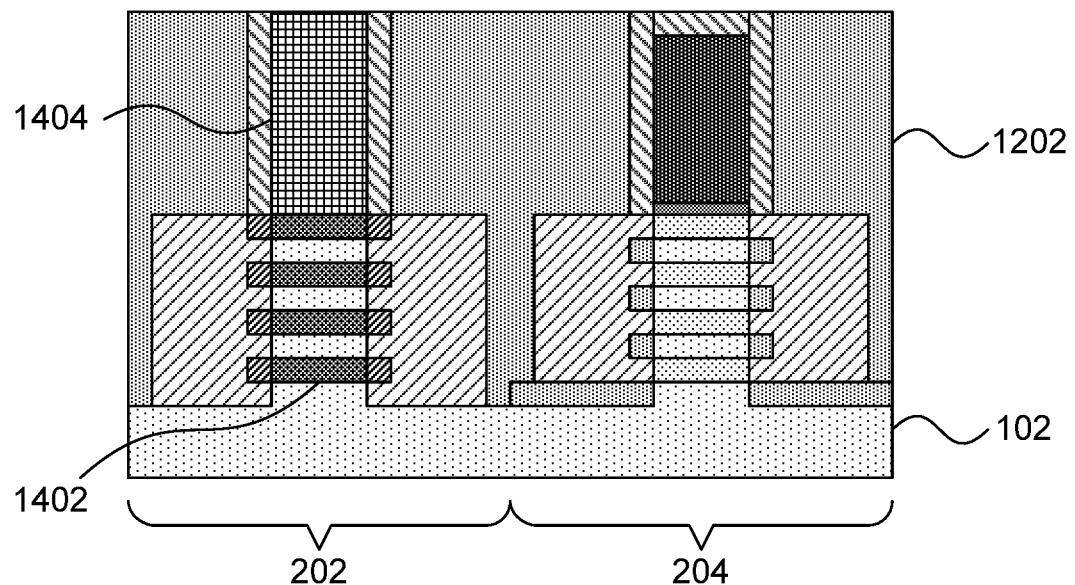
FIG. 14 is a cross-sectional diagram of a step in the formation of an integrated chip in accordance with the present principles.

Referring now to FIG. 14, a cross-sectional diagram of a step in forming nanosheet FETs having different channel properties is shown. An n-type work function metal layer 1402 is deposited around the second channel layers 704 in the nFET region 202. Although it is not shown in this figure, a layer of work function metal will also be deposited along the vertical sidewalls of the gap. A gate contact 1404 is deposited over the n-type work function metal layer 1402. It is specifically contemplated that the gate contact 1404 may be formed from tungsten, but any appropriate conductive material may be used instead.

As used herein, an "n-type work function metal layer" is a metal layer that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of titanium aluminum, tantalum nitride, titanium nitride, hafnium nitride, hafnium silicon, or combinations thereof. The n-type work function metal layer can be deposited using CVD, ALD, or plating.

Figure 15:
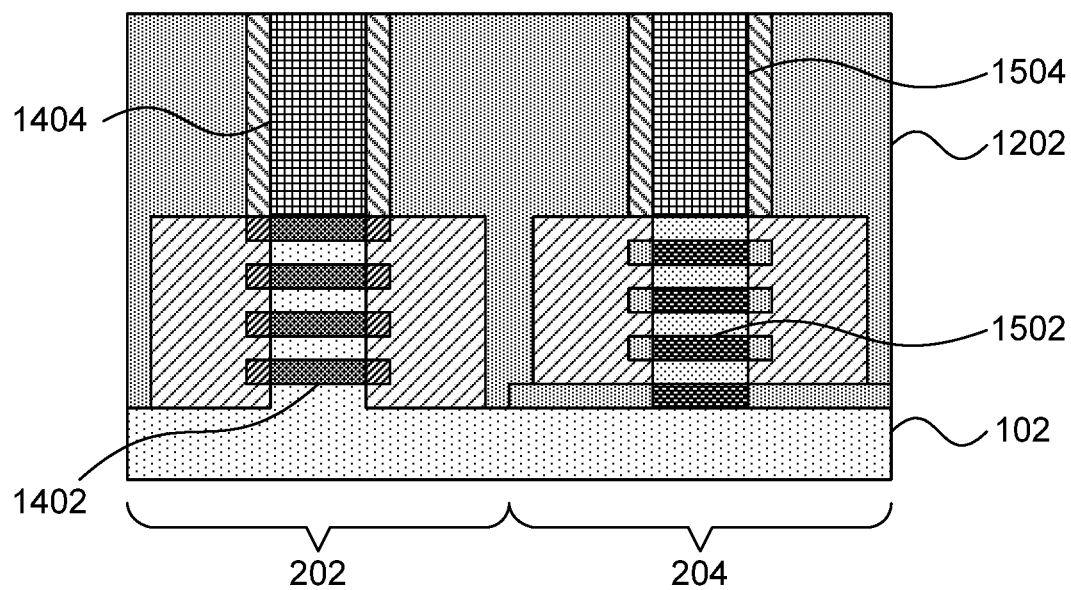
FIG. 15 is a cross-sectional diagram of a step in the formation of an integrated chip in accordance with the present principles.

Referring now to FIG. 15, a cross-sectional diagram of a step in forming nanosheet FETs having different channel properties is shown. As with the nFET region 202, the hardmask 210, dummy gate 208, and dummy gate dielectric 209 are removed from the pFET region 204, along with remaining portions of the second channel material layers 106 to expose the etched first channel material layers 402. A p-type work function metal layer 1502 is deposited around the first channel material layers 402. A gate contact 1504 is deposited over the n-type work function metal layer 1402. As with gate contact 1404, it is specifically contemplated that the gate contact 1504 may be formed from tungsten, but any appropriate conductive material may be used instead.

As used herein, a "p-type work function metal layer" is a metal layer that effectuates a p-type threshold voltage shift. In one embodiment, the work function of the p-type work function metal layer ranges from 4.9 eV to 5.2 eV. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower." "above," "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 16:
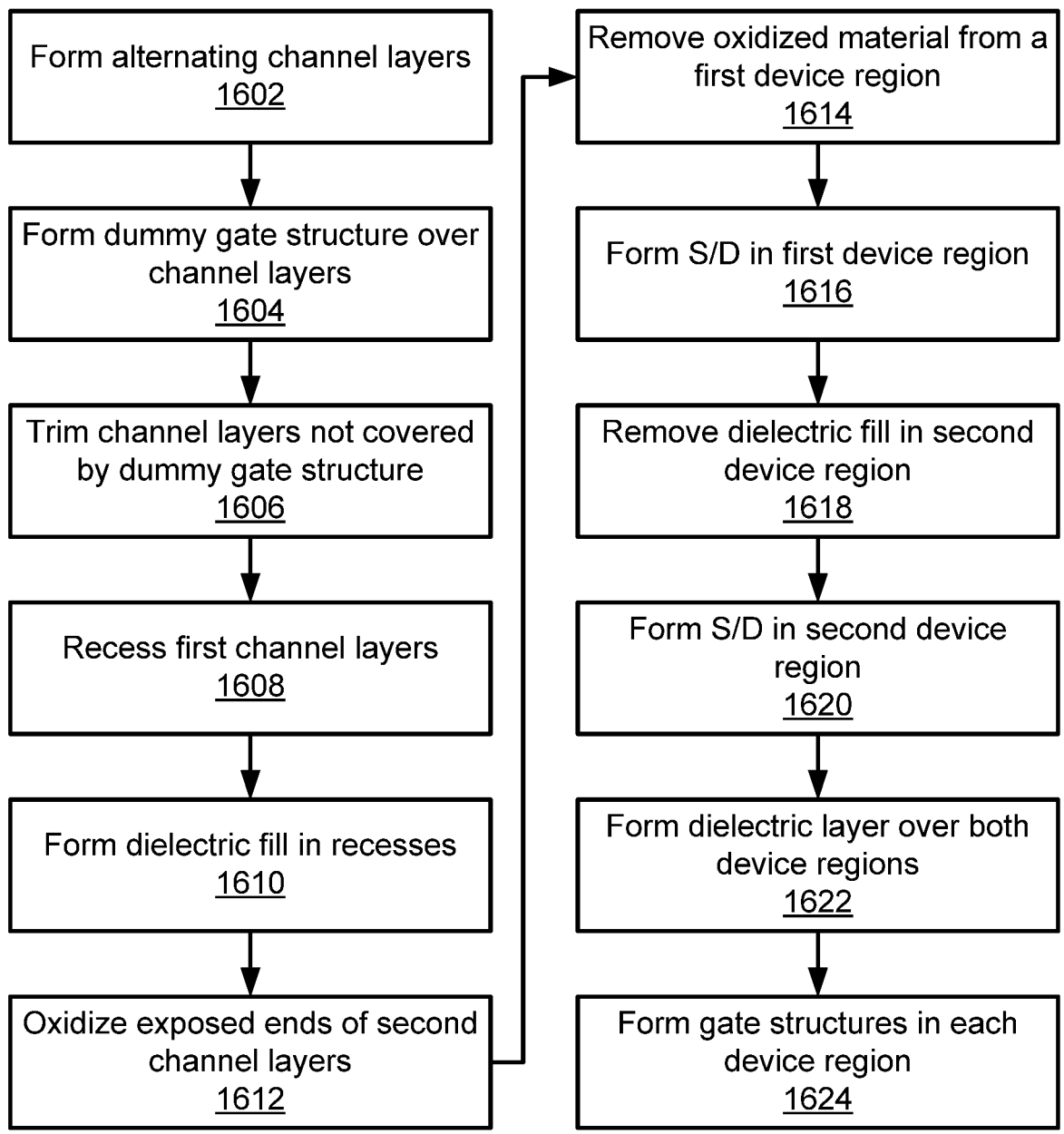
FIG. 16 is a block/flow diagram of a method for forming an integrated chip in accordance with the present principles.

Referring now to FIG. 16, a method for forming nanosheet FETs having different channel properties is shown. Block 1602 forms alternating channel layers 104 and 106 (e.g., alternating between silicon and silicon germanium) on a substrate 102. Block 1604 forms dummy gate structures over the stack 108 of alternating channel layers in a first device region 202 and a second device region 204. Block 1606 then trims the channel layers in the stack 108 that are not covered by the dummy gate structures using, e.g., an anisotropic etch.

Block 1608 recesses the first channel layers 104 using an isotropic etch that removes material laterally while leaving the second channel layers 106 relatively undisturbed. Block 1610 then fills in the recesses with a dielectric material. Block 1612 oxidizes the ends of the second channel layers 106.

Block 1614 removes the oxidized material from a first device region 202 that corresponds to, e.g., nFET devices. Block 1616 grows source/drain regions 802 from the exposed ends of the second channel layers 106. The second device region 204 may be masked during the etching and growth processes in the first device region 202.

Block 1618 removes the dielectric fill at the ends of the first channel layers 402 in the second device region 204. Block 1620 then grows source/drain regions 1102 from the exposed ends of the first channel layers 402. The first device region 202 may be masked during the etching and growth processes.

Block 1622 forms dielectric layer 1202 over both device regions by, e.g., depositing a flowable oxide material and polishing the resulting layer down to the level of the dummy gate structure using a CMP process. Block 1624 forms gate structures in each of the device regions, by removing the dummy gate structures and either the first or second channel layer materials from each of the device regions. The final gate structures are formed by depositing a respective work function metal layer in each device region and a gate contact in contact with the work function metal layer. It is specifically contemplated that the work function metal layers will be different in the two device regions such that the devices will have different properties. For example an n-type work function metal layer 1402 may be deposited in the first device region 202 and a p-type work function metal layer 1502 may be deposited in the second device region 204. Contacts may be formed to the respective source and drain regions by any appropriate process, forming electrical contacts to said regions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming semiconductor devices:
    forming dielectric plugs at exposed ends of first channel material layers in stacks of alternating first channel material layers and second channel material layers, wherein the second channel material layers comprise a different material than the first channel material layers;
    forming caps at exposed ends of the second channel material layers, wherein the caps comprise a different material from the dielectric plugs;
    etching away the caps in a first device region; and
    etching away the dielectric plugs in a second device region.

2. The method of claim 1, wherein the step of forming caps at exposed ends of the second channel material layers comprises oxidizing the exposed ends of the second channel material layers.

3. The method of claim 1, wherein the step of forming dielectric plugs at exposed ends of the first channel material layers comprises:
    laterally etching the first channel material layers to create cavities;
    filling the cavities with a conformal dielectric layer; and
    etching to remove the conformal dielectric layer from regions other than the cavities.

4. The method of claim 1, wherein:
    the first channel material layers consist of silicon germanium.

5. The method of claim 4, wherein:
    the second channel material layers consist of silicon.

6. The method of claim 1, wherein:
    the second channel material layers consist of silicon.

7. The method of claim 1, further comprising:
    forming n-type doped first source/drain regions in a first device region; and
    forming p-type doped second source/drain regions in a second device region.

8. The method of claim 7, wherein the n-type doped first source/drain regions extend laterally underneath gate spacers of an n-type field effect transistor and the p-type doped second source/drain regions extend laterally underneath gate spacers of a p-type field effect transistor.

9. The method of claim 1, further comprising etching away the first channel material layers in the first device region and etching away the second channel material layers in the second device region.

10. The method of claim 9, further comprising depositing a first work function metal layer around the second channel material layers in the first device region and depositing a second work function metal layer around the first channel material layers in the second device region.

11. A method of forming semiconductor devices, the method comprising:
    forming dummy gate structures on stacks of alternating first channel material layers and second channel material layers in a first device region and a second device region, wherein the first channel material layers comprise a first material, and wherein the second channel material layers comprise a second material different than the first material;

in both the first device region and the second device region, etching away material of the stacks of alternating first channel material layers and second channel material layers in areas that are not covered by the dummy gate structures;

in both the first device region and the second device region, laterally etching first channel material layers to create cavities at ends of the first channel material layers;

in both the first device region and the second device region, forming dielectric plugs in the cavities at the ends of the first channel material layers; and in both the first device region and the second device region, forming caps at exposed ends of the second channel material layers, wherein the caps comprise a different material than the dielectric plugs;

forming n-type doped first source/drain regions in the first device region; and forming p-type doped second source/drain regions in the second device region.

12. The method of claim 11, wherein the step of forming caps at exposed ends of the second channel material layers comprises oxidizing the exposed ends of the second channel material layers.

13. The method of claim 11, wherein the step of forming dielectric plugs in the cavities at the ends of the first channel material layers comprises:
filling the cavities with a conformal dielectric layer; and
etching to remove the conformal dielectric layer from regions other than the cavities.

14. The method of claim 11, wherein:
the first channel material layers consist of silicon germanium.

15. The method of claim 14, wherein:
the second channel material layers consist of silicon.

16. The method of claim 11, wherein:
the second channel material layers consist of silicon.

17. The method of claim 11, further comprising etching away the first channel material layers in the first device region and etching away the second channel material layers in the second device region.

18. The method of claim 11, further comprising depositing a first work function metal layer around the second channel material layers in the first device region and depositing a second work function metal layer around the first channel material layers in the second device region.

19. The method of claim 11, wherein the p-type doped second source/drain regions extend laterally underneath gate spacers of a p-type field effect transistor.

20. The method of claim 19, wherein the n-type doped first source/drain regions extend laterally underneath gate spacers of an n-type field effect transistor.

* * * * *